(12) United States Patent
Liao et al.

(10) Patent No.: US 8,217,522 B2
(45) Date of Patent: Jul. 10, 2012

(54) PRINTED CIRCUIT BOARD WITH COEXTENSIVE ELECTRICAL CONNECTORS AND CONTACT PAD AREAS

(75) Inventors: Chih-Chin Liao, Changhua (TW); Han-Shiao Chen, Taichung (TW); Chin-Tien Chiu, Taichung (TW); Ken Jian Ming Wang, San Francisco, CA (US); Cheeman Yu, Madison, WI (US); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/819,840

(22) Filed: Jun. 21, 2010

(65) Prior Publication Data

US 2010/0252315 A1    Oct. 7, 2010

Related U.S. Application Data

(62) Division of application No. 11/449,493, filed on Jun. 8, 2006, now Pat. No. 7,746,661.

(51) Int. Cl.
*H01L 23/48* (2006.01)
*H01L 23/52* (2006.01)
*H01L 29/40* (2006.01)
(52) U.S. Cl. .......... 257/786; 257/784; 257/698
(58) Field of Classification Search ........ 257/698, 257/758, 784, 786
See application file for complete search history.

(56) References Cited

U.S. PATENT DOCUMENTS

| | | | |
|---|---|---|---|
| 4,225,900 A | 9/1980 | Ciccio et al. | |
| 5,798,563 A * | 8/1998 | Feilchenfeld et al. | 257/668 |
| 6,706,973 B2 | 3/2004 | DiStefano et al. | |
| 6,912,780 B2 | 7/2005 | Chamberlin et al. | |
| 7,059,049 B2 * | 6/2006 | Farquhar et al. | 29/852 |
| 7,148,554 B2 * | 12/2006 | Nah et al. | 257/532 |
| 7,291,929 B2 * | 11/2007 | Tanaka et al. | 257/784 |
| 7,301,103 B2 | 11/2007 | Tanaka et al. | |
| 7,307,293 B2 * | 12/2007 | Fjelstad et al. | 257/200 |
| 7,459,340 B2 * | 12/2008 | Wakabayashi et al. | 438/107 |
| 7,745,922 B2 * | 6/2010 | Lee | 257/691 |
| 7,842,597 B2 * | 11/2010 | Tsai | 438/613 |
| 7,863,727 B2 * | 1/2011 | Lake | 257/698 |
| 2003/0123234 A1 | 7/2003 | Happoya | |
| 2004/0155333 A1 | 8/2004 | Yang et al. | |
| 2004/0231885 A1 | 11/2004 | Borland et al. | |

FOREIGN PATENT DOCUMENTS

JP   2005033042 A   2/2005

OTHER PUBLICATIONS

International Search Report dated Nov. 20, 2007 in PCT Application No. PCT/US2007/069708.

(Continued)

*Primary Examiner* — S. V. Clark
(74) *Attorney, Agent, or Firm* — Vierra Magen Marcus & DeNiro LLP

(57) ABSTRACT

A printed circuit board is disclosed having coextensive electrical connectors and contact pad areas. Areas of the contact pads where the traces and/or vias are located may be etched away to ensure electrical isolation between the traces, vias and contact pads.

13 Claims, 8 Drawing Sheets

OTHER PUBLICATIONS

Restriction Requirement dated Sep. 8, 2008 in U.S. Appl. No. 11/449,493.
Response to Restriction Requirement filed Sep. 25, 2008 in U.S. Appl. No. 11/449,493.
Office Action dated Dec. 23, 2008 in U.S. Appl. No. 11/449,493.
Response to Office Action filed Mar. 23, 2009 in U.S. Appl. No. 11/449,493.
Office Action dated Jul. 22, 2009 in U.S. Appl. No. 11/449,493.
Response to Office Action filed Oct. 22, 2009 in U.S. Appl. No. 11/449,493.
Notice of Allowance and Fee(s) Due dated Feb. 23, 2010 in U.S. Appl. No. 11/449,493.
Office Action dated May 31, 2010 in Taiwanese Application No. 096119010.
Response to Office Action filed Nov. 26, 2010, Taiwanese Application No. 096119010.

* cited by examiner

PRINTED CIRCUIT BOARD WITH COEXTENSIVE ELECTRICAL CONNECTORS AND CONTACT PAD AREAS

PRIORITY DATA

This application is a divisional of U.S. patent application Ser. No. 11/449,493 filed Jun. 8, 2006, now U.S. Pat. No. 7,746,661, entitled "Printed Circuit Board With Coextensive Electrical Connectors And Contact Pad Areas", which application is incorporated herein by reference in its entirety.

BACKGROUND OF THE INVENTION

1. Field of the Invention

Embodiments of the present invention relate to a printed circuit board having coextensive electrical connectors and contact pad areas.

2. Description of the Related Art

The strong growth in demand for portable consumer electronics is driving the need for high-capacity storage devices. Non-volatile semiconductor memory devices, such as flash memory storage cards and devices, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Flash memory devices may include a printed circuit board ("PCB") for supporting electronic components and/or for transmitting electrical signals and power and ground voltages. In general, a PCB may include one or more layers of a dielectric substrate having a conductive layer laminated onto one or both surfaces. Using techniques such as photolithography, conductance patterns may be defined in the conductive layers. The conductance patterns include electrical traces for communicating signals and power/ground voltage to and from the electronic components on the PCB.

Although it is known to form conductance patterns with very fine electrical traces, owing to the number of connections required on modern-day PCBs, there may not be enough surface area in a single-layered PCB to affect the required signal and voltage (power and ground) transfer. It is therefore known to form PCBs with a plurality of conductive layers, each separated by a dielectric substrate. At present, it is known to provide PCBs with as many as twenty or more layers. In order to communicate signals and power/ground voltages between the various layers, holes, known as vias, are formed through respective layers. Once formed, the vias are either plated or filled with a metal to provide electrical communication between adjacent layers.

It is known to form vias all the way through the substrate by mechanical drilling methods. A problem with this approach is that substrates often include large contact pads for receiving surface mounted components. Conventionally, the contact pads have been defined with a size and shape matching the size and shape of the contact to be surface mounted thereto. With their relatively large size, a pair of vias formed straight through the substrate may short together as a result of their both being in electrical communication with a single contact pad. Therefore, conventional PCBs include a large "keep-out" area surrounding the contact pads on the substrate, within which keep-out area no vias are formed.

An example of a conventional PCB is shown in the prior art FIGS. 1 and 2 which show a cross-sectional view and a bottom view, respectively, of a PCB substrate 20. FIG. 1 shows substrate 20 including a plurality of dielectric layers 22, metal layers 24, vias 26 and contact pads 28. The substrate 20 may also be laminated with a solder mask 30. FIG. 1 also illustrates contacts 32 which have been surface mounted to the contact pads 28 as by soldering. As indicated above, the contact pads 28 have conventionally been formed to match the size and shape of the contacts 32 soldered thereto. As shown in FIG. 1, without a keep-out area, two vias 26a and 26b might short together as a result of being formed in contact with a single contact pad (contact pad 28a in this example). In order to avoid this possibility, keep-out areas 34 are defined on the substrate, as shown in dashed lines in FIG. 2, within which no vias a formed.

As an alternative to vias formed straight through a substrate by mechanical drilling, vias may be formed with a laser. Such vias may be "blind," i.e., visible from only one of the top and bottom surfaces of the PCB, or "buried," i.e., not visible from either the top or bottom surface of the PCB. Blind and buried vias are, however, difficult to fabricate and add time and expense to the substrate manufacturing process.

SUMMARY OF THE INVENTION

Embodiments of the present invention relate in general to a PCB having coextensive electrical connectors and contact pad areas. The PCB may be formed of one or more layers, each layer including a dielectric core interspersed with a conductive layer. In embodiments, there may be between one and twenty or more such layers in the PCB.

A conductance pattern including traces may be formed in the top and/or bottom conductive layers of the PCB, and one or more vias may be drilled through the PCB. In embodiments, the vias may be drilled straight through using a mechanical drilling process.

Contact pads for receiving surface mounted components may be patterned in the top and/or bottom conductance pattern. Areas of the contact pads where the electrical connectors (i.e., the traces and/or vias) are located may be etched away to ensure electrical isolation between the electrical connectors and the contact pads. That is, the pattern mask for the conductance pattern may be patterned to form the contact pads with one or more voids, such as for example notches in the edges of a contact pad, openings in the middle of a contact pad and/or linear openings across a contact pad to avoid contact with the electrical connectors.

Altering the shape of the contact pads to include voids that allow electrical connectors to be provided in the area of the contact pads eases the restrictions on the definition of the trace and via layout. Moreover, altering the shape of the contact pads to include voids allowing vias to be provided in the area of the contact pads increases the number of vias which may be formed through the PCB. This easing of the restrictions in defining the trace and via layout, as well as the increase in the number of vias which may be formed through the PCB may allow a reduction in the number of layers required in the PCB.

The contact pads may be etched in numerous configurations to ensure electrical isolation between the contact pads and electrical connectors. In one alternative embodiment, the contact pads may maintain a rectangular shape, but the size of the contact pads may be made smaller than the contacts of an electronic component with which the contact pads are to mate. In a further embodiment of the present invention, the contact pads may be defined on the PCB in a plurality of discrete sections which are separated by etched away spaces including electrical connectors. In a still further embodiment of the present invention, one or more of the contact pads may include an irregular, rectilinear shape.

DETAILED DESCRIPTION

Embodiments of the invention will now be described with reference to FIGS. 3 through 21 which relate to a printed circuit board having coextensive electrical connectors and contact pad areas. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
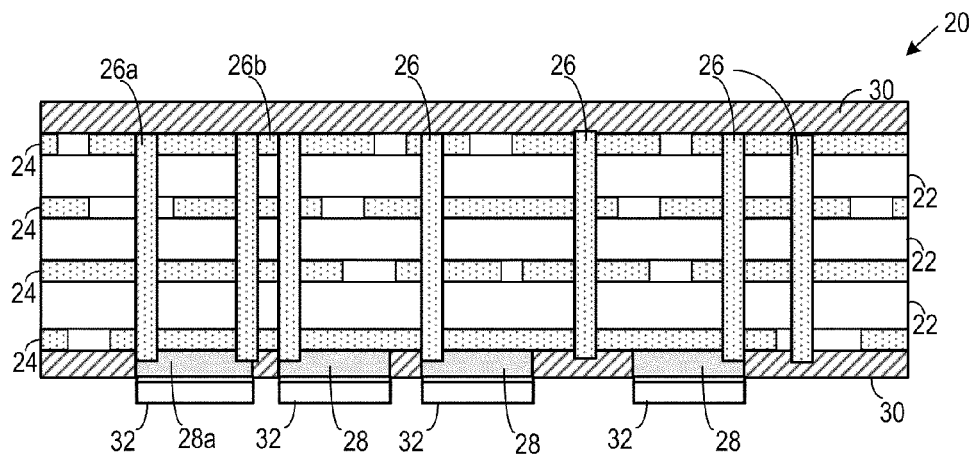
FIG. 1 is a cross-sectional side view of a conventional PCB including contacts of an electronic component surface mounted to conventional contact pads.
Figure 2:
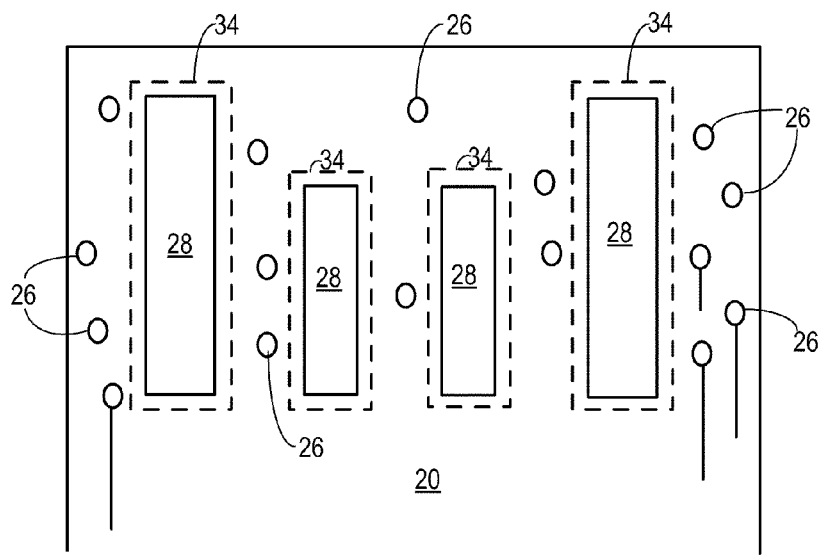
FIG. 2 is a top view of a portion of a conventional PCB.
Figure 3:
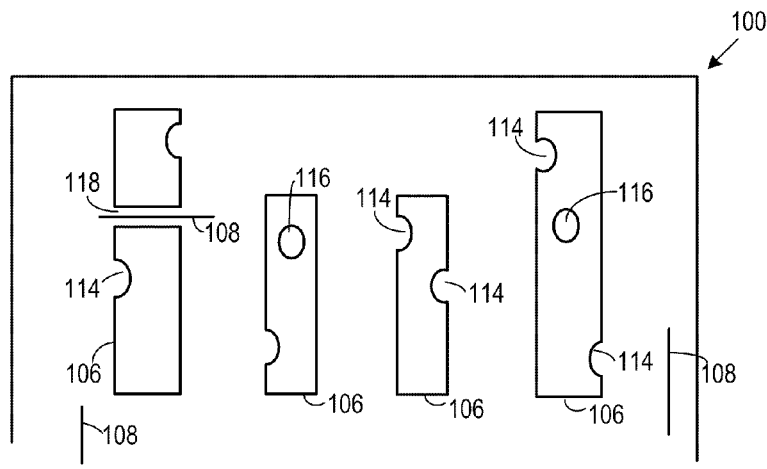
FIG. 3 is a top view of a portion of a PCB according to an embodiment of the present invention during fabrication.
Figure 4:
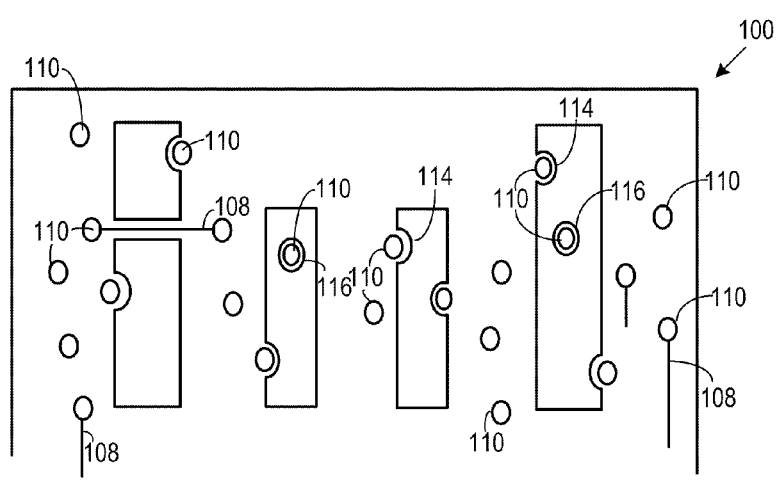
FIG. 4 is a top view of a portion of a PCB according to an embodiment of the present invention.
Figure 5:
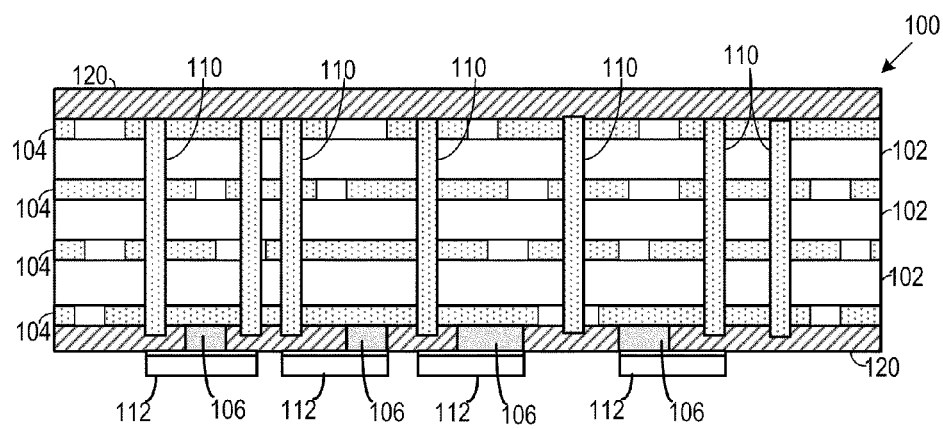
FIG. 5 is a cross-sectional side view of a PCB according to an embodiment of the present invention.

Referring initially to the top views of FIGS. 3 and 4 and the cross-sectional view of FIG. 5, there is shown a portion of a printed circuit board ("PCB") 100. As used herein, a PCB is defined broadly to include any of a variety of substrates to which electronic components may be mounted by surface mounting technology ("SMT") or other affixation schemes.

PCB 100 may be formed of one or more layers, each layer including a core 102 interspersed with conductive layers 104. In embodiments, PCB 100 may be comprised of a single core 102 laminated with a conductive layer 104 on its top and/or bottom surface. In further embodiments, PCB 100 may include two or more layers. The cores 102 may each be formed of various dielectric materials such as for example, polyimide laminates, epoxy resins including FR4 and FR5, bismaleimide triazine (BT), and the like. Although not critical to the present invention, each core may have a thickness of between 40 µm to 200 µm, although the thickness of the cores may vary outside of that range in alternative embodiments. Each core may be ceramic or organic in alternative embodiments.

The conductive layers 104 may be formed of copper or copper alloys, plated copper or plated copper alloys, Alloy 42 (42Fe/58Ni), copper plated steel, or other metals and materials known for use on substrates. The layers may have a thickness of about 10 µm to 24 µm, although the thickness of the layers may vary outside of that range in alternative embodiments.

Figure 6:
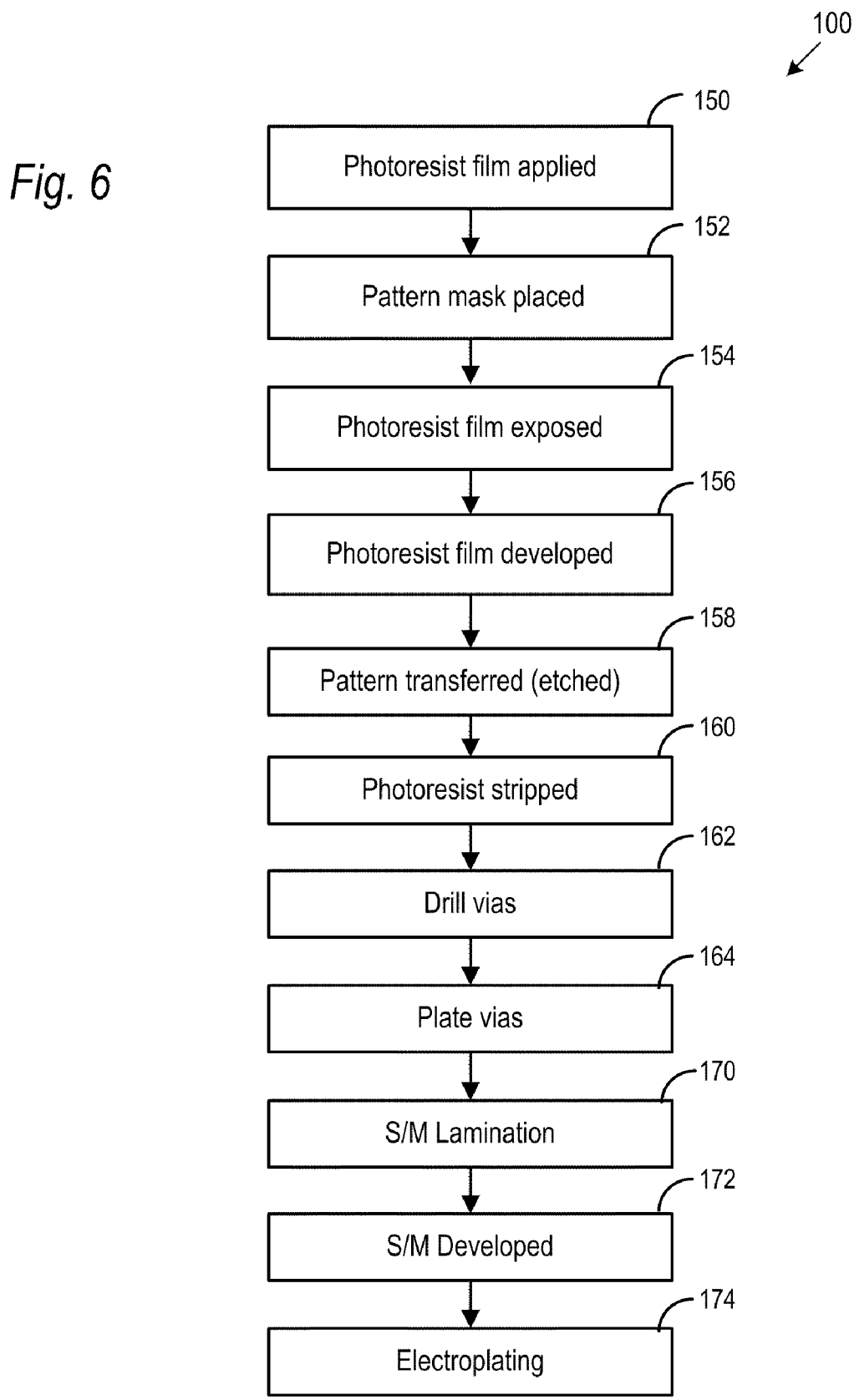
FIG. 6 is a flowchart of a process for fabricating a PCB according to an embodiment of the present invention.

One process for forming the PCB 100 is explained with reference to the flowchart of FIG. 6. The process may begin with a core 102 and conductive layers 104 laminated on the top and/or bottom surfaces of the core. Conductance patterns which define a network of electrical traces 108 are then formed in the top and/or bottom conductive layers 104. A photoresist film is then applied over the surfaces of the conductive layers in step 150. A pattern mask containing the outline of the electrical conductance pattern may then be placed over the photoresist film in step 152. The photoresist film is exposed (step 154) and developed (step 156) to remove the photoresist from areas on the conductive layers that are to be etched. The exposed areas are next etched away using an etchant such as ferric chloride in step 158 to define the conductance patterns on the core. Next, the photoresist is removed in step 160. Other known methods for forming the conductance pattern on PCB 100 are contemplated.

If additional layers are to be provided on PCB 100, the layers are next added above and/or below the existing layers, and the above steps for defining conductance patterns are repeated for the newly added conductive layers. Once all layers have been added to PCB 100, the exterior (top and/or bottom) conductive layers may be provided with contact pads 106 in addition to electrical traces 108, as shown in FIG. 3. The contact pads 106 are provided for receiving contacts 112 (FIG. 5) of an electronic component, which contacts 112 are affixed to the contact pads 106 by SMT or other adhering schemes. As discussed in the Background of the Invention section, contact pads in conventional PCBs were defined with a size and shape to match that of the contact to be affixed to the contact pad. However, in accordance with embodiments of the present invention, the contact pads 106 are shaped as shown to allow coextensive vias and traces as explained hereinafter in greater detail.

After formation of the conductance patterns on the PCB 100, vias 110 may be formed through the PCB in step 162 and as shown in FIG. 4. The vias 110 may be drilled in known mechanical drilling processes straight through the PCB. While mechanical drilling offers advantages of simplicity and low cost, other drilling methods, such as laser drilling, may be used. In embodiments where, for example, the vias are formed by laser, it is understood that one or more of the vias 110 need not be formed straight through the layers of the PCB 100, but instead may be blind or buried vias.

The vias 110 may be electroplated or otherwise filled in step 164. As explained in the Background of the Invention, conventional PCBs include a keep-out area around the contact pads to prevent shorting together of vias formed through the PCB. In accordance with embodiments of the present invention, there is no keep-out area (or the size of the keep-out area may be reduced), and the vias and traces may be provided in the PCB in the area otherwise occupied by the contact pads as shown in FIGS. 4 and 5.

In particular, an optimized trace and via layout is defined for the PCB 100, without regard to the position of the contact pads 106 (or at least with the position of the contact pads 106 being a diminished factor in the trace and via layout in comparison to conventional systems). Thereafter, the contact pads are patterned with a shape that allows for the position of the traces and vias, i.e., the areas of the contact pads where the traces and vias are located are etched away to ensure electrical isolation between the traces, vias and contact pads. In order to accomplish this, the pattern mask used to provide the otherwise rectangular or uniformly shaped contact pads 106 during the photolithography process is patterned to account for the position of the traces and vias that have been provided in the area of the contact pads. That is, the pattern mask may be patterned to form the contact pads 106 with one or more voids, such as for example notches 114 in the edges of a contact pad, openings 116 in the middle of a contact pad and/or linear openings 118 across a contact pad, all as shown in FIG. 3 to avoid contact with the traces 108 and/or vias 110. The traces 108 and/or vias 110 may be referred to herein as "electrical connectors."

As seen in FIGS. 3 and 4, the linear openings 118 allow the traces 108 to be formed in the area of the contact pads 106, while remaining electrically isolated from contact pads 106. The linear openings may divide the contact pad 106 into separate discrete sections. The edges which define the linear opening 118 may be straight as shown, or may be curvilinear.

As seen in FIGS. 4 and 5, when the vias 110 are formed in the PCB 100, the notches 114 and openings 116 allow the vias 110 to be formed in the area of the contact pads 106, while remaining electrically isolated from contact pads 106. The notches 114 may be formed between or at the corners of the contact pads 106, and may be rounded as shown, or some other shape including square, rectangular, etc. Openings 116 may be provided entirely within a contact pad 106, and may be rounded as shown, or some other shape including square, rectangular, etc. As explained hereinafter, the shape of the contact pads may be modified in other ways to avoid contact with traces and vias defined in the area of the contact pads.

Altering the shape of the contact pads to include voids that allow electrical connectors to be provided in the area of the contact pads eases the restrictions on the definition of the trace and via layout. Moreover, altering the shape of the contact pads to include voids allowing vias to be provided in the area of the contact pads increases the number of vias which may be formed through the PCB. This easing of the restrictions in defining the trace and via layout, as well as the increase in the number of vias which may be formed through the PCB may allow a reduction in the number of layers required in the PCB.

After formation of the vias 110 and the conductance pattern(s) including the irregular shaped contact pads, the PCB 100 may be laminated with a solder mask 120 as shown in FIG. 5 and as indicated in step 170. Solder mask 120 isolates and protects the electrical conductance patterns defined on the substrate. In step 172, the solder mask 128 may be developed to expose the irregular-shaped contact pads 106 so that they may be plated.

In step 174, the irregular-shaped contact pads 106 may be plated with a layer of resistive metal in a known electroplating process. The electrical terminals of the conductance pattern may be plated with a metal film, such as for example gold, though other metals, including tin, tin-lead and nickel may be plated onto the conductance pattern(s) in alternative embodiments.

Figure 7:
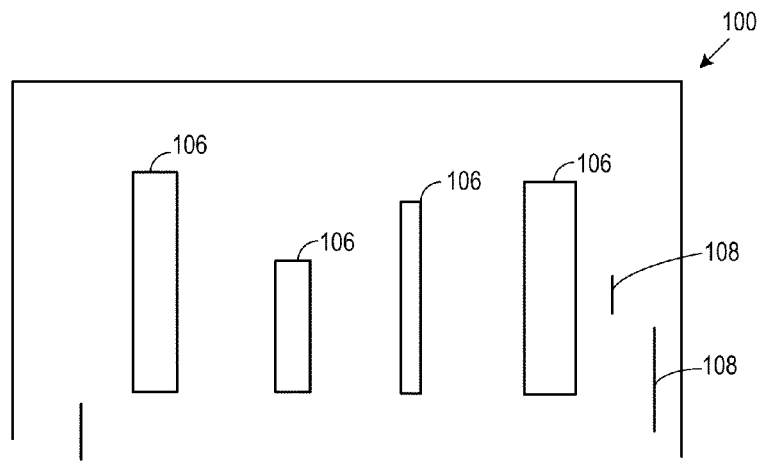
FIG. 7 is a top view of a portion of a PCB according to an alternative embodiment of the present invention during fabrication.
Figure 8:
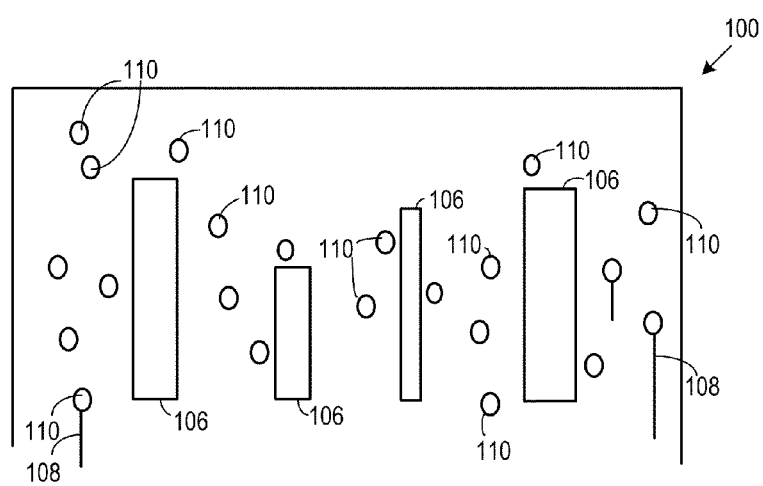
FIG. 8 is a top view of a portion of a PCB according to an alternative embodiment of the present invention.
Figure 9:
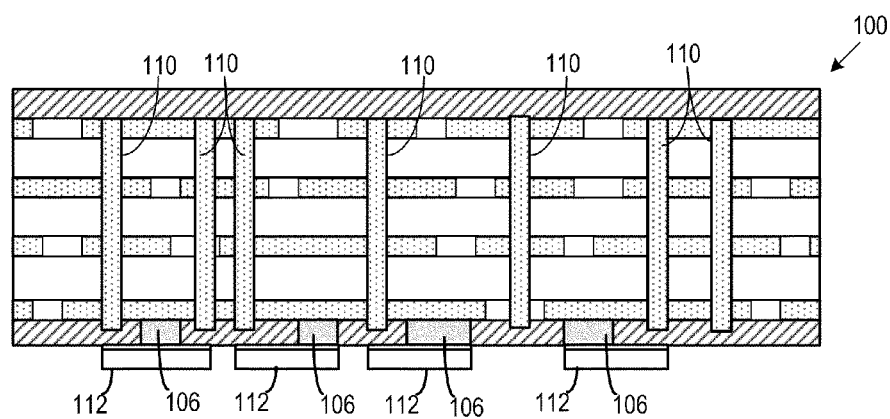
FIG. 9 is a cross-sectional side view of a PCB according to an alternative embodiment of the present invention.

As indicated above, the contact pads 106 may be etched in numerous configurations to ensure electrical isolation between the contact pads and electrical connectors. A further embodiment is shown in FIGS. 7-9. In this embodiment, the trace and via layout may be optimized with little or no regard for the position of the contact pads as above. Moreover, in the embodiment of FIGS. 7-9, the contact pads 106 may be defined on the PCB with a rectangular or other uniform shape. However, as shown in FIGS. 7-9, the size of the contact pads may be made smaller than the contacts 112 with which the contact pads 106 are to mate. The sizes of the contact pads 106 in FIGS. 7-9 are selectively reduced so as to ensure that there is no overlap between the contact pads and any vias or traces formed in the area of the contact pads. The length, width and/or aspect ratio of a particular contact pad 106 may be varied relative to its corresponding contact 112, depending on the proximity of the electrical connectors to that particular contact.

Figure 10:
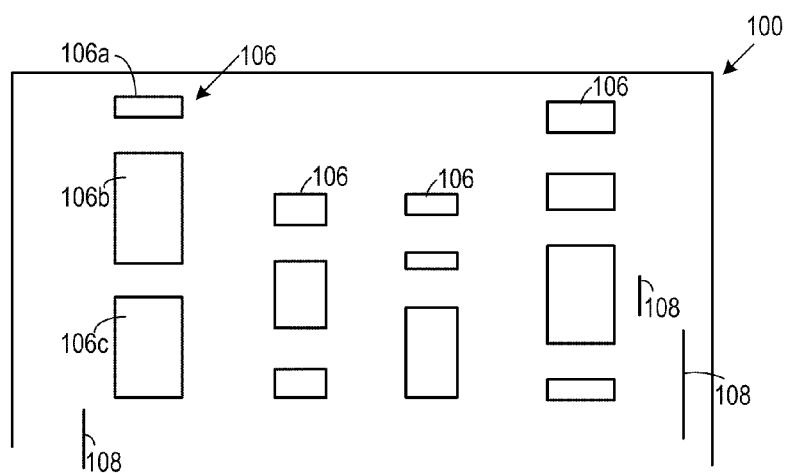
FIG. 10 is a top view of a portion of a PCB according to a further alternative embodiment of the present invention during fabrication.
Figure 11:
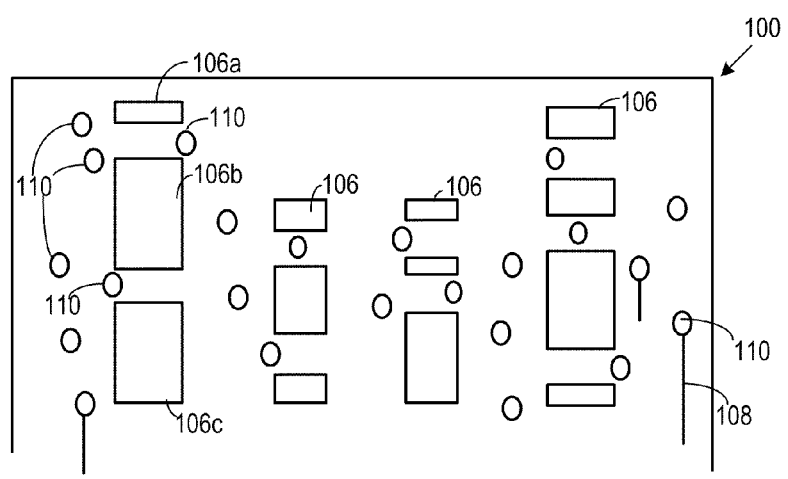
FIG. 11 is a top view of a portion of a PCB according to a further alternative embodiment of the present invention.
Figure 12:
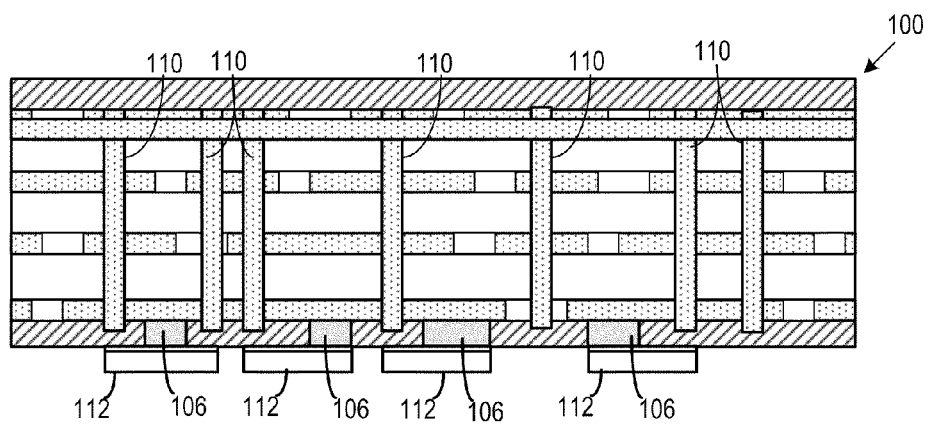
FIG. 12 is a cross-sectional side view of a PCB according to a further alternative embodiment of the present invention.

A further embodiment of the present invention is shown in FIGS. 10-12, in which one or more of the contact pads are defined on PCB 100 in a plurality of discrete sections, such as for example sections 106a, 106b and 106c shown in FIG. 10. In particular, in defining the pattern of the contact pads with the pattern mask, spaces may be left between discrete sections of the contact pads 106, in which spaces traces 108 and/or vias 110 may be provided as shown in FIGS. 11 and 12. It is understood that the discrete sections may be formed of any length. Moreover, while etched portions defining the discrete sections are shown as being horizontal (across the width) of a contact pad in FIGS. 10 and 11, it is understood that the etched portions defining the discrete sections may be vertical (along the length) of a contact pad.

Figure 13:
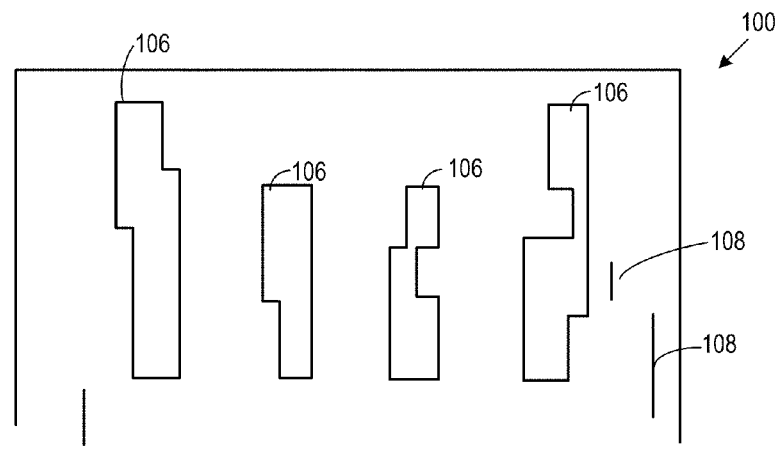
FIG. 13 is a top view of a portion of a PCB according to a still further alternative embodiment of the present invention during fabrication.
Figure 14:
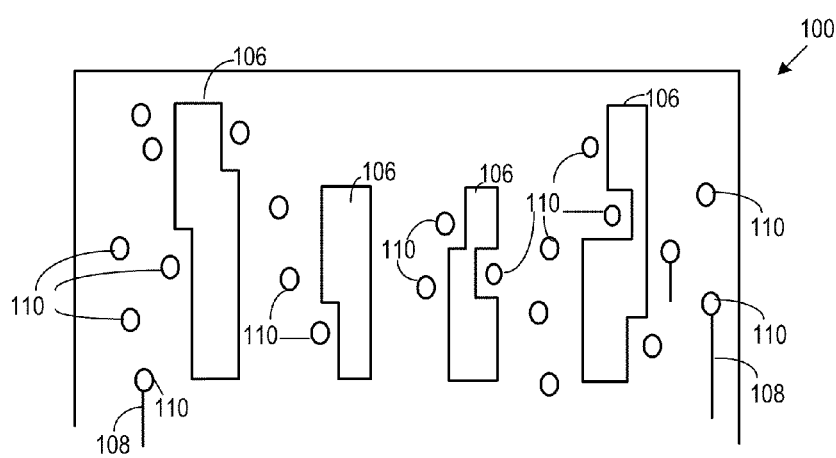
FIG. 14 is a top view of a portion of a PCB according to a still further alternative embodiment of the present invention.
Figure 15:
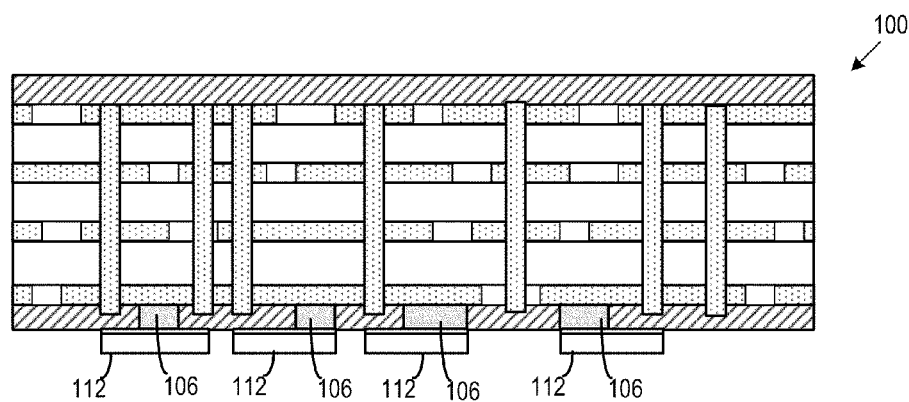
FIG. 15 is a cross-sectional side view of a PCB according to a still further alternative embodiment of the present invention.

A still further embodiment of the present invention is shown in FIGS. 13-15, where one or more of the contact pads 106 may include an irregular, rectilinear shape as shown in FIG. 13. As seen in FIGS. 14 and 15, the irregular, rectilinear shape of contact pads 106 is laid out in the pattern mask and determined by the position of traces 108 and/or vias 110 so that the electrical connectors 108, 110 avoid the contact pads 106 and remain electrically isolated from the contact pads. It is understood that contact pads 106 in this embodiment may be formed with any of a variety of irregular, rectilinear shapes to accommodate the position of the traces 108 and/or vias 110. It is understood that contact pads 106 may additionally or alternatively include irregular, curvilinear shapes in further embodiments.

In the above-described embodiments, portions of contact pads 106 have been etched away to provide clearance between the contact pads 106 and any electrical connectors 108 or 110 located in the area of the contact pads. Those portions of the contact pads which were not etched away are solid, uniform metal. In a further alternative embodiment of the present invention shown in FIGS. 15-18, portions of the contact pads 106 may be etched away to make room for the traces and/or vias as described above. However, in addition, those portions of the contact pads not affected by the presence of a trace or via may still be etched in a pattern, such as for example the crosshatched pattern shown in FIGS. 16-18.

Figure 16:
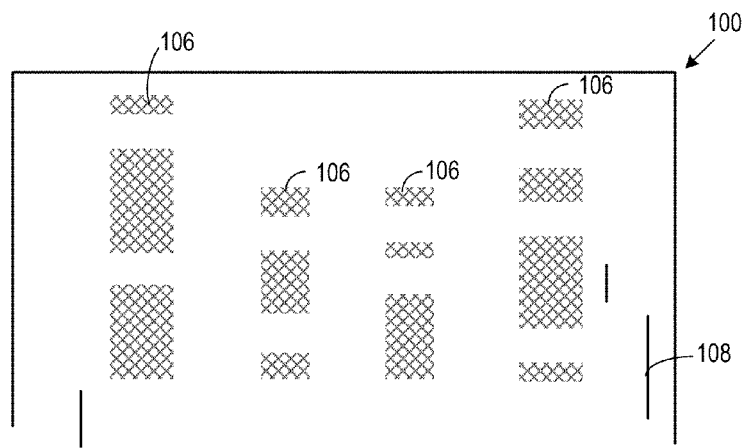
FIG. 16 is a top view of a portion of a PCB according to another alternative embodiment of the present invention during fabrication.
Figure 17:
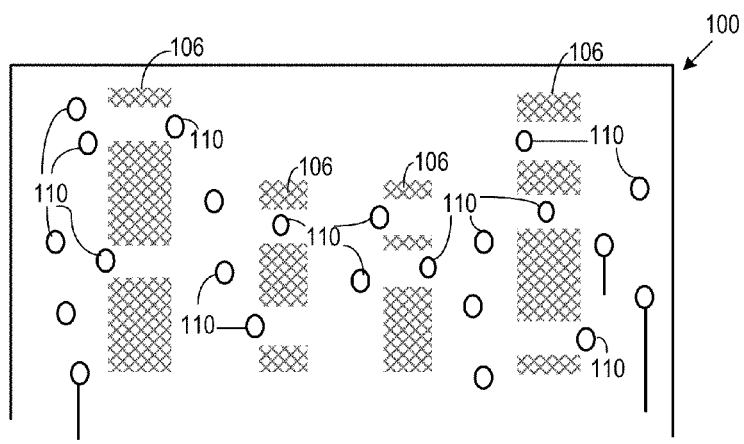
FIG. 17 is a top view of a portion of a PCB according to another alternative embodiment of the present invention.
Figure 18:
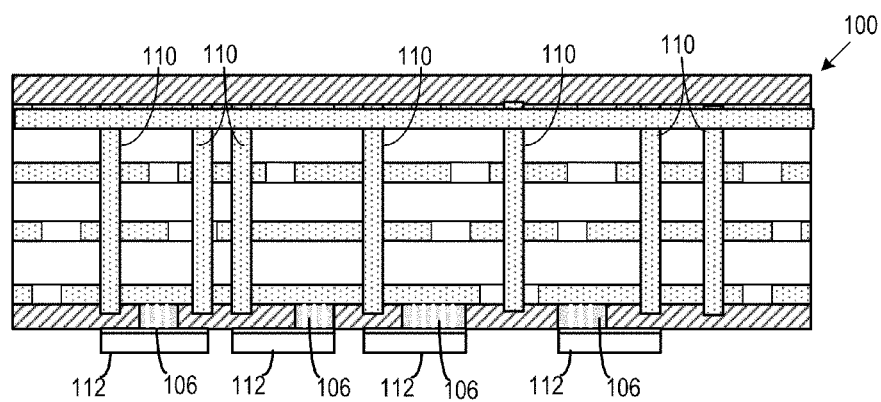
FIG. 18 is a cross-sectional side view of a PCB according to another alternative embodiment of the present invention.

For the embodiment of FIGS. 16-18, it is understood that the portions of contact pads 106 not affected by the presence of a trace or via may include a variety of other etched patterns in further embodiments of the present invention. The embodiments shown in FIGS. 16-18 include contact pads which have been etched into discrete sections, similar to the embodiment described above with respect to FIGS. 10-12. However, it is understood that the embodiment of FIGS. 16-18 may include contact pads 106 having patterned sections and etched away sections in accordance with any of the above-described embodiments to allow electrical isolation between contact pads 106, traces 108 and vias 110.

Those of skill in the art will appreciate that contact pads 106 may be defined on PCB 100 to include voids in a variety of other shapes than those expressly disclosed above in further embodiments of the present invention. Moreover, it is understood that a set of contact pads 106 on PCB 100 may be configured in a combination of the above-described embodiments.

Figure 19:
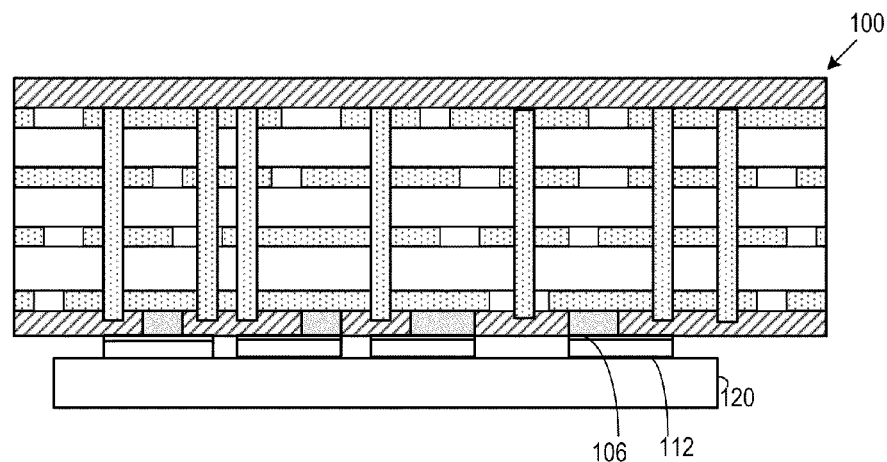
FIG. 19 is a cross-sectional side view of a PCB according to embodiments of the present invention and including an electronic component mounted thereto.
Figure 20:
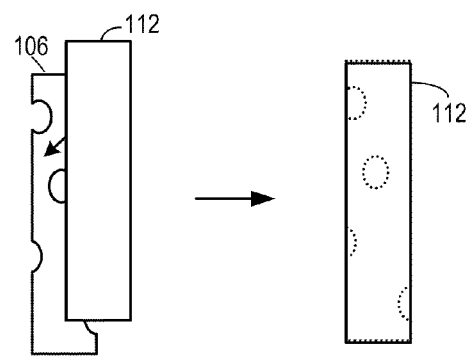
FIG. 20 illustrates the mating of a contact of the electronic component with a contact finger of the PCB according to embodiments of the present invention.

FIG. 19 shows a cross-sectional side view of a PCB 100 including contact pads 106 configured according to an embodiment of the present invention, and further including an electronic component 120 mounted to PCB 100 via contacts 112 described above. In embodiments, contacts 112 of an electronic component 120 may be soldered on top of contact pads 106 in a known SMT process. It is understood that contacts 112 of component 120 may be affixed to contact pads 106 by a variety of other known affixation schemes. As indicated in FIG. 20, contact pad 106 may include the same general outline shape of contact 112, with the exception that contact pad 106 may include voids to accommodate the locations of traces 108 and/or vias 110 as described above. While the contact pads 106 and contacts 112 have been shown with a generally rectangular outline, it is understood that the contact pads 106 and contacts 112 may be provided with other rectilinear and/or curvilinear outlines in alternative embodiments.

Figure 21:
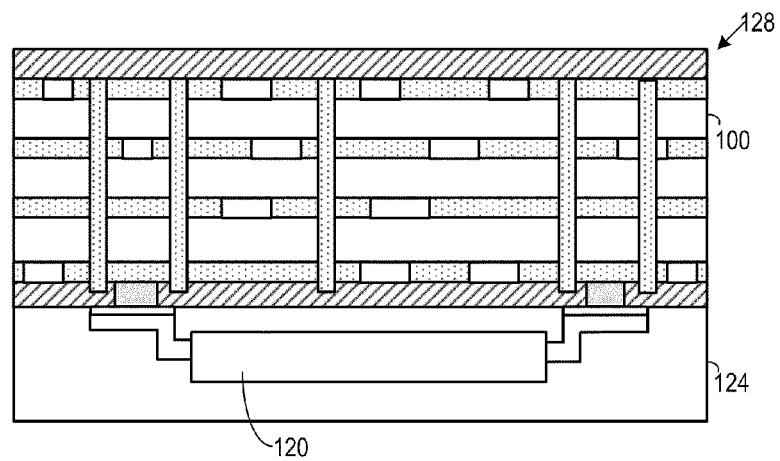
FIG. 21 is a cross-sectional end view of a semiconductor package including a PCB according to embodiments of the present invention.

FIG. 21 is a cross-sectional end view of a finished semiconductor package 128 including the PCB 100 according to embodiments of the present invention, and a surface mounted electronic component 120 encased within a molding compound 124. It is understood that electronic component 120 may be any of a variety of surface mounted components including for example a lead frame mounted semiconductor package, a land grid array (LGA) package, a ball grid array (BGA) package and/or a variety of surface mounted passive components. Semiconductor package 128 may be configured for one of a variety of different applications, including for example a non-volatile semiconductor memory device such as a flash memory storage card or device. Such devices include but are not limited to an SD Card, a Compact Flash, a Smart Media, a Mini SD Card, an MMC, an xD Card, a Transflash or a Memory Stick and an SD-USB combination memory device. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package, comprising:
    a printed circuit board including a conductance pattern on a surface of the printed circuit board;
    an electronic component including a contact of a given shape mounted to the surface of the printed circuit board;
    a contact pad defined in the conductance pattern of the printed circuit board including a shape differing from a shape of the electronic component contact in that one or more portions of the conductance pattern defining the contact pad have been left devoid of conductive material; and
    an electrical connector positioned at least partially within the one or more portions of the conductance pattern defining the contact pad that have been left devoid of conductive material.

2. A semiconductor package as recited in claim 1, wherein the one or more portions of the conductance pattern defining the contact pad that have been left devoid of conductive material comprise a notch defined within an edge of the contact pad.

3. A semiconductor package as recited in claim 1, wherein the one or more portions of the conductance pattern defining the contact pad that have been left devoid of conductive material comprise an opening defined within an interior of the contact pad.

4. A semiconductor package as recited in claim 1, wherein the one or more portions of the conductance pattern defining the contact pad that have been left devoid of conductive material comprise a section extending between a pair of opposed edges of the contact pad.

5. A semiconductor package as recited in claim 1, wherein the one or more portions of the conductance pattern defining the contact pad that have been left devoid of conductive material comprise an irregular, rectilinear shape etched away from the contact pad.

6. A semiconductor package as recited in claim 1, wherein the one or more portions of the conductance pattern defining the contact pad that have been left devoid of conductive material comprise an irregular, curvilinear shape etched away from the contact pad.

7. A semiconductor package as recited in claim 1, wherein the electrical connector comprises a via formed through the surface of the printed circuit board.

8. A semiconductor package as recited in claim 7, the printed circuit board comprising a plurality of layers of a dielectric material interspersed with a plurality of layers of conductive material, wherein the via is drilled straight through the plurality of layers of dielectric material and conductive material.

9. A semiconductor package as recited in claim 8, wherein the via is drilled by a mechanical drilling process.

10. A semiconductor package as recited in claim 1, wherein the electrical connector comprises a trace formed in the conductance pattern of the printed circuit board.

11. A semiconductor package, comprising:
- a printed circuit board including two or more conductive layers and a conductance pattern on a surface of the printed circuit board in a conductive layer of the two or more conductive layers;
- an electronic component including a contact mounted to the surface of the printed circuit board, the contact having a shape that covers a portion of the printed circuit board;
- a contact pad on the printed circuit board within the portion of the printed circuit board covered by the contact of the electronic component; and
- an electrical connector electrically connecting the two or more layers of the printed circuit board, the electrical connector positioned at least partially within the portion of the printed circuit board covered by the contact of the electronic component.

12. A semiconductor package as recited in claim 11, wherein the one or more portions of the conductance pattern defining the contact pad that have been left devoid of conductive material comprise a notch defined within an edge of the contact pad.

13. A semiconductor package as recited in claim 12, wherein the one or more portions of the conductance pattern defining the contact pad that have been left devoid of conductive material comprise an opening defined within an interior of the contact pad.

* * * * *